(12) United States Patent
Ma et al.

(10) Patent No.: US 11,114,605 B2
(45) Date of Patent: Sep. 7, 2021

(54) COMPOSITE STORAGE LAYER FOR MAGNETIC RANDOM ACCESS MEMORY DEVICES

(71) Applicant: HeFeChip Corporation Limited, Sai Ying Pun (HK)

(72) Inventors: Qinli Ma, Mt Kisco, NY (US); Youngsuk Choi, Niskayuna, NY (US); Shu-Jen Han, Armonk, NY (US)

(73) Assignee: HeFeChip Corporation Limited, Sai Ying Pun (HK)

( * ) Notice: Subject to any disclaimer, the term of this patent is extended or adjusted under 35 U.S.C. 154(b) by 165 days.

(21) Appl. No.: 16/529,805

(22) Filed: Aug. 2, 2019

(65) Prior Publication Data
US 2020/0052192 A1 Feb. 13, 2020

Related U.S. Application Data

(60) Provisional application No. 62/717,901, filed on Aug. 12, 2018.

(51) Int. Cl.
*H01L 43/02* (2006.01)
*H01L 27/22* (2006.01)
*H01L 43/10* (2006.01)

(52) U.S. Cl.
CPC ............ *H01L 43/02* (2013.01); *H01L 27/222* (2013.01); *H01L 43/10* (2013.01)

(58) Field of Classification Search
CPC .................. H01L 27/22–228; H01L 43/00–14
See application file for complete search history.

(56) References Cited

U.S. PATENT DOCUMENTS

| 8,871,530 | B1 | 10/2014 | Hu | |
|---|---|---|---|---|
| 9,337,415 | B1 | 5/2016 | Oh | |
| 9,966,529 | B1 * | 5/2018 | Iwata | H01F 10/16 |
| 10,580,969 | B2 * | 3/2020 | Lee | H01L 43/06 |
| 2008/0088980 | A1 * | 4/2008 | Kitagawa | H01F 10/329 360/313 |
| 2012/0023386 | A1 * | 1/2012 | Oh | G11C 11/161 714/769 |
| 2012/0261776 | A1 * | 10/2012 | Tang | H01L 43/08 257/421 |
| 2014/0015078 | A1 * | 1/2014 | Huai | H01L 43/08 257/421 |

(Continued)

OTHER PUBLICATIONS

S. Ikeda et al., Nature materials, A perpendicular-anisotropy CoFeB—MgO magnetic tunnel junction, vol. 9, p. 721-724, Jul. 11, 2010.

(Continued)

*Primary Examiner* — Bryan R Junge
(74) *Attorney, Agent, or Firm* — Winston Hsu

(57) ABSTRACT

A composite storage layer for magnetic memory devices includes a first ferromagnetic layer, a tri-layered spacer stack disposed on the first ferromagnetic layer, a second ferromagnetic layer disposed on the tri-layered spacer stack, and an oxide capping layer on the second ferromagnetic layer. The tri-layered spacer stack comprises a first non-magnetic layer, a discontinuous, insulating oxide layer, and a second non-magnetic layer. The discontinuous, insulating oxide layer is sandwiched by the first non-magnetic layer and the second non-magnetic layer.

26 Claims, 3 Drawing Sheets

(56) References Cited

U.S. PATENT DOCUMENTS

2017/0256703 A1* 9/2017 Zhu ................ H01F 10/30
2018/0226569 A1* 8/2018 Chia ................ G11C 11/161

OTHER PUBLICATIONS

H. Sato et al., Applied Physics Letters 101, 022414(2012), Perpendicular-anisotropy CoFeB—MgO magnetic tunnel junctions with a MgO/CoFeB/Ta/CoFeB/MgO recording structure, 2012 American Institute of Physics, Jul. 13, 2012.

D. C. Worledge et al., Applied Physics Letters 98, 022501(2011), Spin torque switching of perpendicular Ta|CoFeB|MgO-based magnetic tunnel junctions, 2011 American Institute of Physics, Jan. 10, 2011.

* cited by examiner

COMPOSITE STORAGE LAYER FOR MAGNETIC RANDOM ACCESS MEMORY DEVICES

CROSS REFERENCE TO RELATED APPLICATIONS

This application claims priority from U.S. provisional application No. 62/717,901, filed Aug. 12, 2018, which is included in its entirety herein by reference.

BACKGROUND OF THE INVENTION

1. Field of the Invention

The invention relates to a magnetic memory device, and more particularly, to a composite storage layer of a magnetic tunnel junction (MTJ) element in a magnetic memory device.

2. Description of the Prior Art

Magnetoresistive random access memory (MRAM), based on the integration of silicon CMOS with MTJ technology, is a major emerging technology that is highly competitive with existing semiconductor memories such as SRAM, DRAM, Flash, etc. A MRAM device is generally comprised of an array of parallel first conductive lines such as word lines on a horizontal plane, an array of parallel second conductive lines such as bit lines on a second horizontal plane spaced above and formed in a direction perpendicular to the first conductive lines, and a MTJ element interposed between a first conductive line and a second conductive line at each crossover location. Typically, access transistors may be disposed below the array of first conductive lines to select certain MRAM cells within the MRAM array for read or write operations.

A MTJ element may be based on a tunnel magneto-resistance (TMR) effect wherein a stack of layers has a configuration in which two ferromagnetic layers are separated by a thin non-magnetic dielectric layer or tunnel barrier layer. If the tunnel barrier layer is thin enough (typically a few angstroms to a few nanometers), electrons can tunnel from one ferromagnet into the other. In a MRAM device, the MTJ element is typically formed between a bottom electrode and a top electrode. A MTJ stack of layers that is subsequently patterned to form a MTJ element may be formed by sequentially depositing a seed layer, an anti-ferromagnetic (AFM) pinning layer, a ferromagnetic "pinned" layer, a thin tunnel barrier layer, a ferromagnetic "free" layer or storage layer, and a capping layer. The AFM layer holds the magnetic moment of the pinned layer in a fixed direction. Conventionally, the free layer is made of NiFe because of its reproducible and reliable switching characteristics.

It is desirable to provide an improved storage layer of a MTJ element in a magnetic memory device, which is able to provide high perpendicular magnetic anisotropy (PMA), low damping, and high TMR ratio.

SUMMARY OF THE INVENTION

It is one object of the present disclosure to provide.

One aspect of the present disclosure provides a composite storage layer for magnetic memory devices including a first ferromagnetic layer, a tri-layered spacer stack disposed on the first ferromagnetic layer, a second ferromagnetic layer disposed on the tri-layered spacer stack, and an oxide capping layer on the second ferromagnetic layer.

According to some embodiments, the first ferromagnetic layer and the second ferromagnetic layer are comprised of Fe-rich alloys or magnetic multilayer.

According to some embodiments, the first ferromagnetic layer is disposed directly on a tunnel barrier layer.

According to some embodiments, the first ferromagnetic layer has a surface that forms a first interface with the tunnel barrier layer and the other surface that forms a second interface with the tri-layered spacer stack to obtain perpendicular magnetic anisotropy.

According to some embodiments, the second ferromagnetic layer has one surface that forms a first interface with the oxide capping layer and the other surface that forms a second interface with the tri-layered spacer stack to obtain perpendicular magnetic anisotropy.

According to some embodiments, the tri-layered spacer stack comprises a first non-magnetic layer, a discontinuous, insulating oxide layer, and a second non-magnetic layer.

According to some embodiments, the discontinuous, insulating oxide layer is sandwiched by the first non-magnetic layer and the second non-magnetic layer.

According to some embodiments, the first non-magnetic layer and the second non-magnetic layer are made of at least one of the following materials: Ta, Mo, W, Ir, Rh, Zr, Nb, Hf, Cr, V, Mg, Bi, and/or combinations thereof.

According to some embodiments, the first non-magnetic layer and the second non-magnetic layer have a thickness ranging from 0.5 angstroms to 2 nanometers.

According to some embodiments, the discontinuous, insulating oxide layer is made of at least one of the following materials: MgO, $AlO_x$, $TiO_x$, $HfO_x$, $MgAlO_x$, $MgZnO_x$, $SiO_x$, $TaO_x$, $VO_x$, and/or combinations thereof.

According to some embodiments, the discontinuous, insulating oxide layer has a thickness ranging from 0.1 angstroms to 10 angstroms.

According to some embodiments, the oxide capping layer is made of at least one of the following materials: MgO, $AlO_x$, $TiO_x$, $HfO_x$, $MgAlO_x$, $MgZnO_x$, $SiO_x$, $TaO_x$, $VO_x$, and/or combinations thereof.

According to some embodiments, the oxide capping layer has a thickness ranging from 0.1 angstroms to 10 angstroms.

Another aspect of the present disclosure provides a magnetic tunnel junction (MTJ) element for magnetic memory devices including a reference layer, a tunnel barrier layer contacting the reference layer, and a composite storage layer contacting the tunnel barrier layer. The composite storage layer comprises a first ferromagnetic layer, a tri-layered spacer stack disposed on the first ferromagnetic layer, a second ferromagnetic layer disposed on the tri-layered spacer stack, and an oxide capping layer on the second ferromagnetic layer.

According to some embodiments, the reference layer is made of at least one of the following materials: CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, CoCr, CoCrB, CoCrPt, CoCrPtB, CoCrPd, CoCrTi, CoCrZr, CoCrHf, CoCrV, CoCrNb, CoCrTa, $[Co/Pt]_n$, $[Co/Pd]_n$, $[Co/Ni]_n$, $[CoFe/Pt]_n$, $[Co/Pt(Pd)]_n$, or any combination thereof.

According to some embodiments, the tunnel barrier layer is made of at least one of the following materials: MgO, $AlO_x$, MgAlO, MgZnO, HfO, or any combination thereof.

According to some embodiments, the first ferromagnetic layer and the second ferromagnetic layer are comprised of Fe-rich alloys or magnetic multilayer.

According to some embodiments, the first ferromagnetic layer is disposed directly on a tunnel barrier layer.

According to some embodiments, the first ferromagnetic layer has a surface that forms a first interface with the tunnel barrier layer and the other surface that forms a second interface with the tri-layered spacer stack to obtain perpendicular magnetic anisotropy.

According to some embodiments, the second ferromagnetic layer has one surface that forms a first interface with the oxide capping layer and the other surface that forms a second interface with the tri-layered spacer stack to obtain perpendicular magnetic anisotropy.

According to some embodiments, the tri-layered spacer stack comprises a first non-magnetic layer, a discontinuous, insulating oxide layer, and a second non-magnetic layer.

According to some embodiments, the discontinuous, insulating oxide layer is sandwiched by the first non-magnetic layer and the second non-magnetic layer.

According to some embodiments, the first non-magnetic layer and the second non-magnetic layer are made of at least one of the following materials: Ta, Mo, W, Ir, Rh, Zr, Nb, Hf, Cr, V, Mg, Bi, and/or combinations thereof.

According to some embodiments, the first non-magnetic layer and the second non-magnetic layer have a thickness ranging from 0.5 angstroms to 2 nanometers.

According to some embodiments, the discontinuous, insulating oxide layer is made of at least one of the following materials: MgO, $AlO_x$, $TiO_x$, $HfO_x$, $MgAlO_x$, $MgZnO_x$, $SiO_x$, $TaO_x$, $VO_x$, and/or combinations thereof.

According to some embodiments, the discontinuous, insulating oxide layer has a thickness ranging from 0.1 angstroms to 10 angstroms.

According to some embodiments, the oxide capping layer is made of at least one of the following materials: MgO, $AlO_x$, $TiO_x$, $HfO_x$, $MgAlO_x$, $MgZnO_x$, $SiO_x$, $TaO_x$, $VO_x$, and/or combinations thereof.

According to some embodiments, the oxide capping layer has a thickness ranging from 0.1 angstroms to 10 angstroms.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
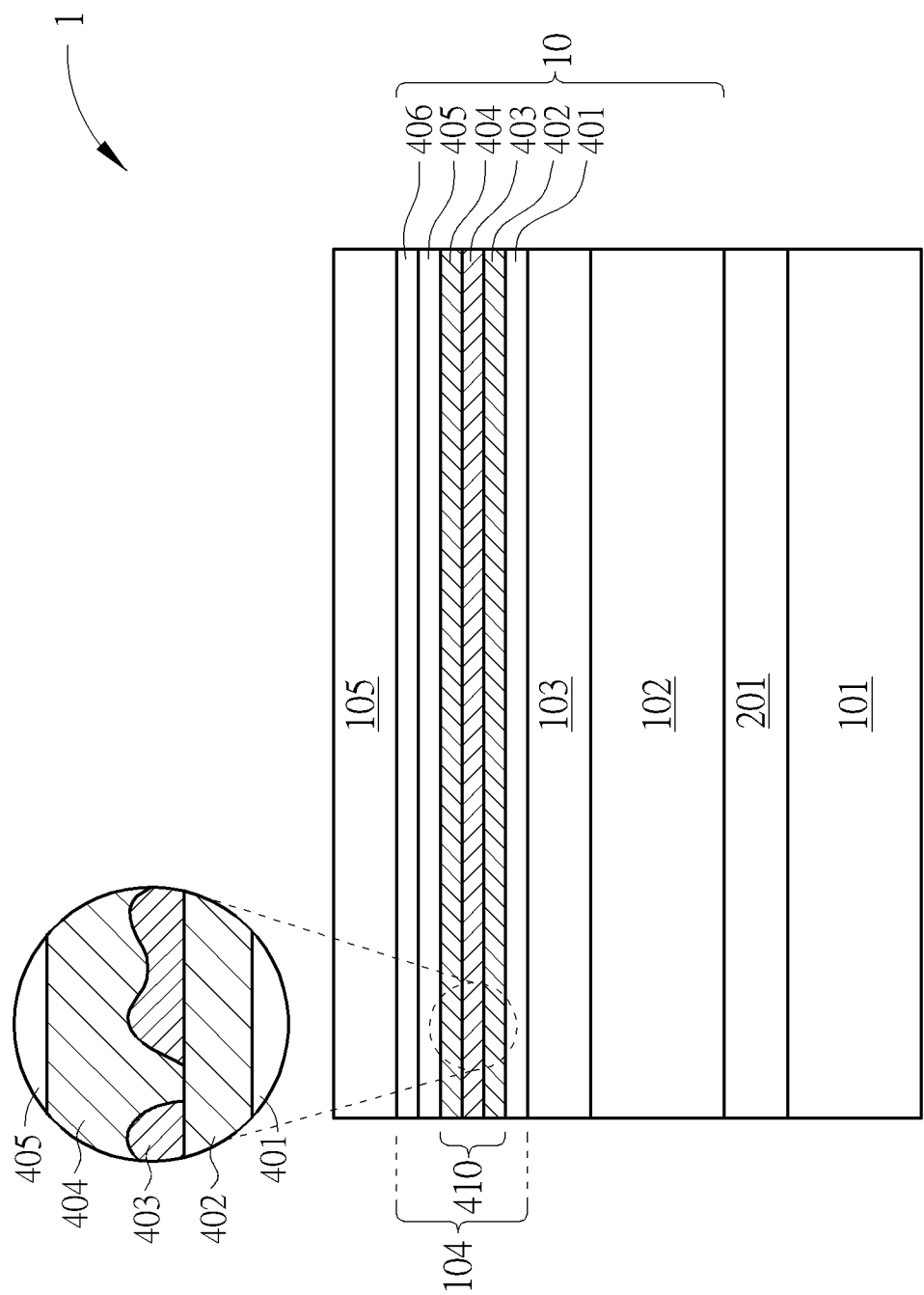
FIG. 1 is a schematic, cross-sectional diagram showing an exemplary magnetoresistive random access memory (MRAM) device having a composite storage layer of a magnetic tunnel junction (MTJ) element according to an embodiment.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

The present disclosure pertains to a composite storage layer of a magnetic tunnel junction (MTJ) element in a magnetic memory device. The composite storage layer may be comprised of a FM1/NM spacer/FM2 stack, wherein FM1 is a first crystalline magnetic layer contacting a tunnel barrier layer, FM2 is a second crystalline magnetic layer contacting an oxide cap layer, and NM spacer is a multi-layered stack comprised of a NM1/oxide-dust layer/NM2 configuration, wherein NM1 and NM2 are non-magnetic layers, and the oxide-dust layer is a discontinuous, insulating oxide layer. The disclosed storage layer when employed in a MTJ element of a magnetic memory device is able to provide high perpendicular magnetic anisotropy (PMA), low damping for lower write voltage, and high tunneling magneto-resistance (TMR) ratio all at the same time.

For example, a magnetoresistive random access memory (MRAM) device may include memory cells in which free magnetic layers are composed of synthetic anti-ferromagnet (SAF). The SAF denotes a layered ferromagnetic structure in which adjacent ferromagnetic layers are antiferromagnetically coupled. For example, a MTJ element may be provided at an intersection of a word line and a bit line. Generally, the MTJ element may be composed of an anti-ferromagnetic layer, a fixed magnetic layer (or a reference layer), a tunnel barrier layer and a free magnetic layer (hereinafter referred to as a storage layer).

Materials used to form MTJ stacks of a MRAM device generally exhibit high TMR, high PMA and good data retention. MTJ structures may be made in a perpendicular orientation, referred to as perpendicular, magnetic tunnel junction (pMTJ) devices. A stack of materials (e.g., cobalt-iron-boron (CoFeB) materials) with a dielectric barrier layer (e.g., magnesium oxide (MgO)) may be used in a pMTJ structure. For example, a pMTJ structure including a stack of materials (e.g., CoFeB/MgO/CoFeB) may be considered for use in MRAM structures.

FIG. 1 is a schematic, cross-sectional diagram showing an exemplary MRAM device having a composite storage layer of a MTJ element according to an embodiment. As shown in FIG. 1, the MRAM device 1 comprises a MTJ element 10 sandwiched between a bottom electrode 101 and a top electrode 105. The MTJ element 10 may be comprised of a reference layer 102 contacting a top surface of the bottom electrode 101, a tunnel barrier layer 103 on the reference layer 102, and a composite storage layer 104 contacting a lower surface of the top electrode 105. The tunnel barrier layer 103 is interposed between the reference layer 102 and the composite storage layer 104.

According to an exemplary embodiment, a seed layer 201 may be interposed between the bottom electrode 101 and the reference layer 102. For example, the seed layer 201 may comprise NiCr, NiFe, or NiFeCr, but is not limited thereto. In an embodiment, the seed layer 201 may be grown on a bottom electrode with an amorphous Ta capping layer, but is not limited thereto.

According to an exemplary embodiment, the reference layer 102 is made of a material having strong perpendicular magnetic anisotropy, which may be made of [Co/Pt]$_n$, [Co/Pd]$_n$, [Co/Ni]$_n$ multilayers, FePt, CoPt, FePd, TeFeCo, GdCo, MnGa, MnGe, MnSi alloys, or any combinations thereof, having a thickness of about 10~100 angstroms.

For example, the reference layer 102 may be formed of a magnetic material comprising Co and Fe, including but not limited to CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combination thereof. Moreover, the reference layer 210 may also have a magnetic superlattice structure comprising repeated alternating layers of two or more materials, such as but not limited to [Co/Pt]$_n$, [Co/Pd]$_n$, [Co/Ni]$_n$, [CoFe/Pt]$_n$, [Co/Pt (Pd)]$_n$, or any combination thereof. Alternatively, the reference layer 102 may be formed of a magnetic material comprising Co and Cr, including but not limited to CoCr, CoCrB, CoCrPt, CoCrPtB, CoCrPd, CoCrTi, CoCrZr, CoCrHf, CoCrV, CoCrNb, CoCrTa, or any combination thereof. Reference layer 102 may also be formed with a synthetic anti-ferromagnetic structure.

According to an exemplary embodiment, the tunnel barrier layer 103 may comprise an insulator, including but not limited to MgO, AlO$_x$, MgAlO MgZnO, HfO, or any combination thereof. According to one embodiment, the tunnel barrier layer 103 may have a thickness of about 0.5 nm-3.0 nm.

According to an exemplary embodiment, the composite storage layer 104 may be a multi-layered stack comprising a ferromagnetic layer 401 disposed directly on the tunnel barrier layer 103, a tri-layered spacer stack 410 disposed directly on the ferromagnetic layer 401, a ferromagnetic layer 405 disposed directly on the tri-layered spacer stack 410, and an oxide capping layer 406 disposed directly on the ferromagnetic layer 405 and directly contacting a lower surface of the top electrode 105. According to an exemplary embodiment, the ferromagnetic layer 401 and the ferromagnetic layer 405 may be comprised of Fe-rich alloys or magnetic multilayer. The ferromagnetic layer 401 has one surface that forms a first interface with the tunnel barrier layer 103 and the other surface that forms a second interface with the tri-layered spacer stack 410 to obtain perpendicular magnetic anisotropy. The ferromagnetic layer 405 has one surface that forms a first interface with the oxide capping layer 406 and the other surface that forms a second interface with the tri-layered spacer stack 410 to obtain perpendicular magnetic anisotropy.

For example, the ferromagnetic layer 401 may be made of at least one of the following materials: Fe, CoFe, CoFeB, CoPt, FePt, CoPd, FePd, and/or combinations thereof. The ferromagnetic layer 405 may be made of at least one of the following materials: Fe, CoFe, CoFeB, CoPt, FePt, CoPd, FePd, and/or combinations thereof. For example, the thickness of the ferromagnetic layer 401 may range from 5 angstroms to 20 angstroms. For example, the thickness of the ferromagnetic layer 405 may range from 5 angstroms to 20 angstroms.

According to an exemplary embodiment, the oxide capping layer 406 may be made of at least one of the following materials: MgO, AlO$_x$, TiO$_x$, HfO$_x$, MgAlO$_x$, MgZnO$_x$, SiO$_x$, TaO$_x$, VO$_x$, and/or combinations thereof. According to an exemplary embodiment, the thickness of the oxide capping layer 406 may range from 1 angstroms to 20 angstroms.

According to an exemplary embodiment, the tri-layered spacer stack 410 comprises a non-magnetic metal layer 402, a discontinuous, insulating oxide layer (also referred to as an oxide dust layer) 403, and a non-magnetic metal layer 404. The oxide dust layer 403 is sandwiched by the non-magnetic layer 402 and the non-magnetic layer 404. According to an exemplary embodiment, the non-magnetic layers 402 and 404 may be made of at least one of the following materials: Ta, Mo, W, Ir, Rh, Zr, Nb, Hf, Cr, V, Mg, Bi, and/or combinations thereof. According to an exemplary embodiment, the thickness of the non-magnetic layer 402 may range from 0.5 angstroms to 20 angstroms. According to an exemplary embodiment, the thickness of the non-magnetic layer 404 may range from 0.5 angstroms to 20 angstroms. The oxide dust layer 403 may be made of at least one of the following materials: MgO, AlO$_x$, TiO$_x$, HfO$_x$, MgAlO$_x$, MgZnO$_x$, SiO$_x$, TaO$_x$, VO$_x$, and/or combinations thereof. According to an exemplary embodiment, the thickness of the oxide dust layer 403 may range from 0.1 angstroms to 10 angstroms. Since the oxide dust layer 403 is a discontinuous layer, the non-magnetic layer 402 may be in direct contact with the non-magnetic layer 404 in some portions, as shown in the enlarged view of FIG. 1.

Figure 2:
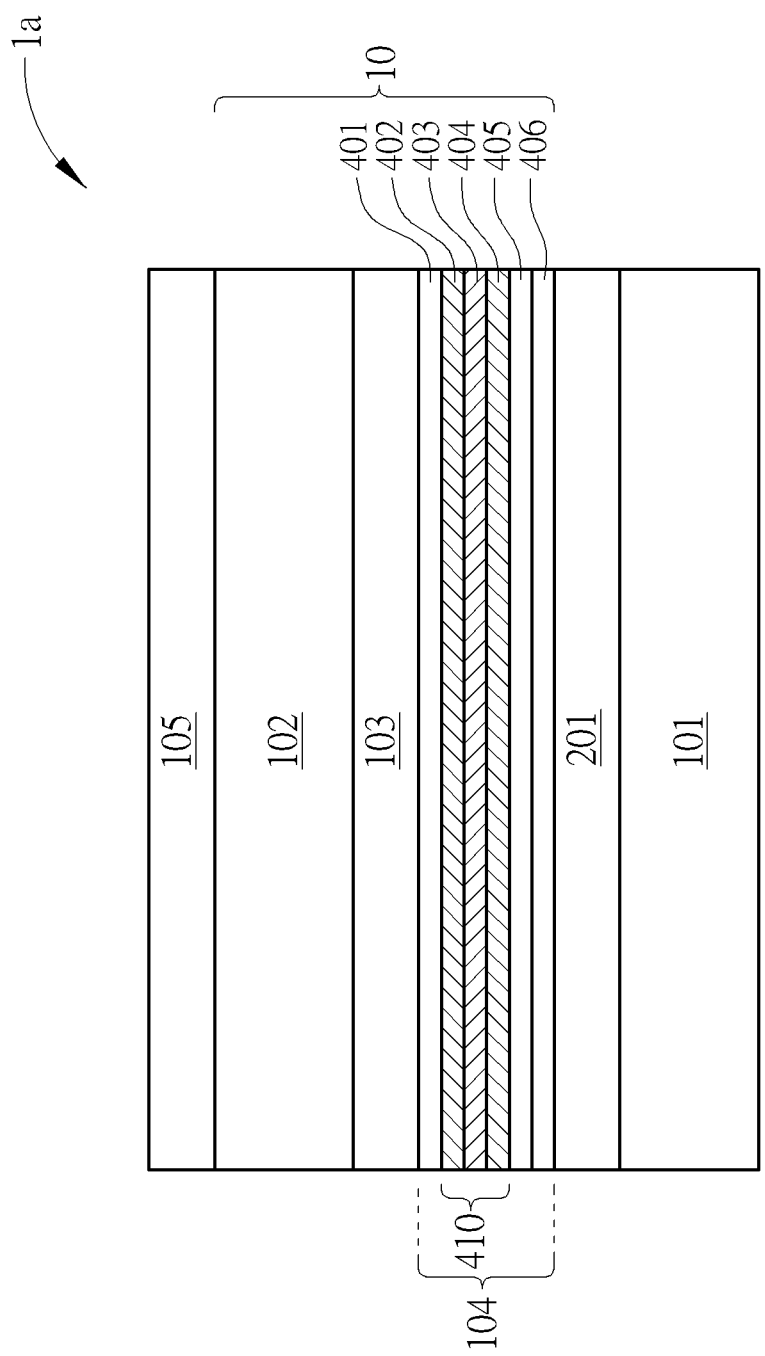
FIG. 2 is a schematic, cross-sectional diagram showing an exemplary MRAM device having a composite storage layer of a MTJ element according to another embodiment.

FIG. 2 is a schematic, cross-sectional diagram showing an exemplary MRAM device having a composite storage layer of a MTJ element according to another embodiment, wherein like numeral numbers designate like regions, layers or elements. As shown in FIG. 2, the MRAM device 1a comprises a MTJ element 10 sandwiched between a bottom electrode 101 and a top electrode 105. The MTJ element 10 is comprised of a bottom electrode 101, a seed layer 201 disposed on the bottom electrode 101, a composite storage layer 104 disposed on the seed layer 201, a tunnel barrier layer 103 on the composite storage layer 104, and a reference layer 102 disposed on the tunnel barrier layer 103 and contacting a lower surface of the top electrode 105. The tunnel barrier layer 103 is interposed between the reference layer 102 and the composite storage layer 104. In general, the stack configuration is a reversed version of the structure shown in FIG. 1.

According to an exemplary embodiment, for example, the seed layer 201 may comprise NiCr, NiFe, or NiFeCr, but is not limited thereto. In an embodiment, the seed layer 201 may be grown on a bottom electrode with an amorphous Ta capping layer, but is not limited thereto.

According to an exemplary embodiment, the reference layer 102 is made of a material having strong perpendicular magnetic anisotropy, which may be made of [Co/Pt]$_n$, [Co/Pd]$_n$, [Co/Ni]$_n$ multilayers, FePt, CoPt, FePd, TeFeCo, GdCo, MnGa, MnGe, MnSi alloys, or any combinations thereof, having a thickness of about 10~100 angstroms.

For example, the reference layer 102 may be formed of a magnetic material comprising Co and Fe, including but not limited to CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combination thereof. Moreover, the reference layer 210 may also have a magnetic superlattice structure comprising repeated alternating layers of two or more materials, such as but not limited to [Co/Pt]$_n$,]Co/Pd]$_n$, [Co/Ni]$_n$, [CoFe/Pt]$_n$, [Co/Pt (Pd)]$_n$, or any combination thereof. Alternatively, the reference layer 102 may be formed of a magnetic material comprising Co and Cr, including but not limited to CoCr, CoCrB, CoCrPt, CoCrPtB, CoCrPd, CoCrTi, CoCrZr, CoCrHf, CoCrV, CoCrNb, CoCrTa, or any combination thereof. Reference layer 102 may also be formed with a synthetic anti-ferromagnetic structure.

According to an exemplary embodiment, the tunnel barrier layer 103 may comprise an insulator, including but not limited to MgO, AlO$_x$, MgAlO MgZnO, HfO, or any combination thereof. According to one embodiment, the tunnel barrier layer 103 may have a thickness of about 0.5 nm-3.0 nm.

According to an exemplary embodiment, the composite storage layer 104 is composed of a multi-layered stack comprising an oxide capping layer 406 disposed directly on the seed layer 201, a ferromagnetic layer 405 disposed directly on the oxide capping layer 406, a tri-layered spacer stack 410 disposed directly on the ferromagnetic layer 405, a ferromagnetic layer 401 disposed directly on the tri-layered spacer stack 410 and directly contacting a lower surface of the tunnel barrier layer 103. According to an exemplary embodiment, the ferromagnetic layer 401 and the ferromagnetic layer 405 may be comprised of Fe-rich alloys or magnetic multilayer. The ferromagnetic layer 401 has one surface that forms a first interface with the tunnel barrier layer 103 and the other surface that forms a second interface with the tri-layered spacer stack 410 to obtain perpendicular magnetic anisotropy. The ferromagnetic layer 405 has one surface that forms a first interface with the oxide capping layer 406 and the other surface that forms a second interface with the tri-layered spacer stack 410 to obtain perpendicular magnetic anisotropy.

For example, the ferromagnetic layer 401 may be made of at least one of the following materials: Fe, CoFe, CoFeB, CoPt, FePt, CoPd, FePd, and/or combinations thereof. The ferromagnetic layer 405 may be made of at least one of the following materials: Fe, CoFe, CoFeB, CoPt, FePt, CoPd, FePd, and/or combinations thereof. For example, the thickness of the ferromagnetic layer 401 may range from 5 angstroms to 20 angstroms. For example, the thickness of the ferromagnetic layer 405 may range from 5 angstroms to 20 angstroms.

According to an exemplary embodiment, the oxide capping layer 406 may be made of at least one of the following materials: MgO, AlO$_x$, TiO$_x$, HfO$_x$, MgAlO$_x$, MgZnO$_x$, SiO$_x$, TaO$_x$, VO$_x$, and/or combinations thereof. According to an exemplary embodiment, the thickness of the oxide capping layer 406 may range from 0.1 angstroms to 10 angstroms.

According to an exemplary embodiment, the tri-layered spacer stack 410 comprises a non-magnetic layer 402, a discontinuous, insulating oxide layer (also referred to as an oxide dust layer) 403, and a non-magnetic layer 404. The oxide dust layer 403 is sandwiched by the non-magnetic layer 402 and the non-magnetic layer 404. According to an exemplary embodiment, the non-magnetic layers 402 and 404 may be made of at least one of the following materials: Ta, Mo, W, Ir, Rh, Zr, Nb, Hf, Cr, V, Mg, Bi, and/or combinations thereof. According to an exemplary embodiment, the thickness of the non-magnetic layer 402 may range from 0.5 angstroms to 5 angstroms. According to an exemplary embodiment, the thickness of the non-magnetic layer 404 may range from 0.5 angstroms to 5 angstroms. The oxide dust layer 403 may be made of at least one of the following materials: MgO, AlO$_x$, TiO$_x$, HfO$_x$, MgAlO$_x$, MgZnO$_x$, SiO$_x$, TaO$_x$, VO$_x$, and/or combinations thereof. According to an exemplary embodiment, the thickness of the oxide capping layer 406 may range from 0.1 angstroms to 10 angstroms.

Figure 3:
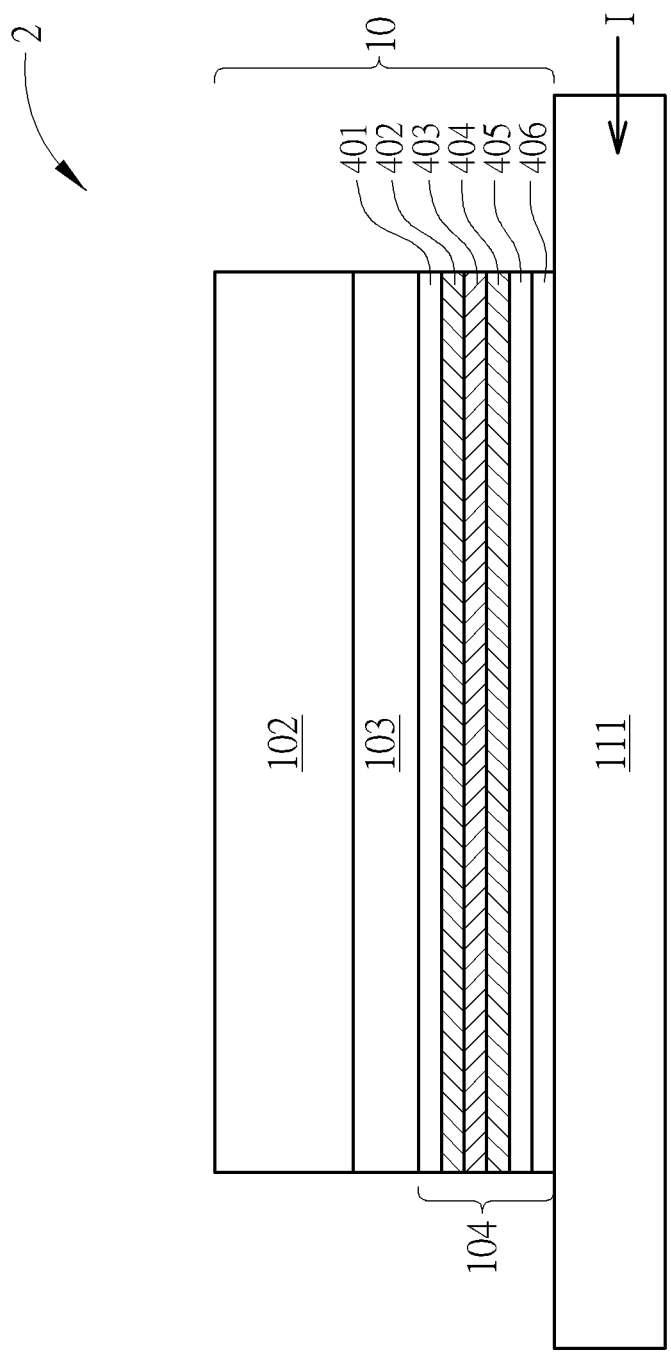
FIG. 3 is a schematic, cross-sectional diagram showing an exemplary spin-orbit torque magnetoresistive random access memory (SOT-MRAM) device having a composite storage layer of a MTJ element according to still another embodiment.

FIG. 3 is a schematic, cross-sectional diagram showing an exemplary spin-orbit torque magnetoresistive random access memory (SOT-MRAM) device having a composite storage layer of a MTJ element according to still another embodiment, wherein like numeral numbers designate like regions, layers or elements. As shown in FIG. 3, the SOT-MRAM device 2 comprises a bottom layer 111, a composite storage layer 104 disposed on the bottom layer 111, a tunnel barrier layer 103 disposed on the composite storage layer 104, and a reference layer 102 disposed on the tunnel barrier layer 103. The electric current I passing through the bottom layer 111 can switch the magnetization of the composite storage layer in the MTJ 10 due to spin-orbit coupling effect.

According to an exemplary embodiment, the bottom layer 111 may be made of a material having large spin-orbit coupling strength, such as Pt, Ta, W, Hf, Ir, CuBi, CuIr, or AuW. In SOT-MRAM, the writing process relies on the transfer of angular momentum from the lattice to the magnetization via the spin-orbit interaction, and it potentially provides lower switching current and immunity to the read disturb commonly seen in the conventional STT-MRAM.

For example, the reference layer 102 may be formed of a magnetic material comprising Co and Fe, including but not limited to CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combination thereof. Moreover, the reference layer 210 may also have a magnetic superlattice structure comprising repeated alternating layers of two or more materials, such as but not limited to $[Co/Pt]_n, [Co/Pd]_n, [Co/Ni]_n, [CoFe/Pt]_n, [Co/Pt(Pd)]_n$, or any combination thereof. Alternatively, the reference layer 102 may be formed of a magnetic material comprising Co and Cr, including but not limited to CoCr, CoCrB, CoCrPt, CoCrPtB, CoCrPd, CoCrTi, CoCrZr, CoCrHf, CoCrV, CoCrNb, CoCrTa, or any combination thereof.

According to an exemplary embodiment, the tunnel barrier layer 103 may comprise an insulator, including but not limited to MgO, $AlO_x$, MgAlO MgZnO, HfO, or any combination thereof. According to one embodiment, the tunnel barrier layer 103 may have a thickness of about 0.5 nm-3.0 nm.

According to an exemplary embodiment, the composite storage layer 104 is composed of a multi-layered stack comprising an oxide capping layer 406 disposed directly on the bottom layer 111, a ferromagnetic layer 405 disposed directly on the oxide capping layer 406, a tri-layered spacer stack 410 disposed directly on the ferromagnetic layer 405, a ferromagnetic layer 401 disposed directly on the tri-layered spacer stack 410 and directly contacting a lower surface of the tunnel barrier layer 103. According to an exemplary embodiment, the ferromagnetic layer 401 and the ferromagnetic layer 405 may be comprised of Fe-rich alloys or magnetic multilayer. The ferromagnetic layer 401 has one surface that forms a first interface with the tunnel barrier layer 103 and the other surface that forms a second interface with the tri-layered spacer stack 410 to obtain perpendicular magnetic anisotropy. The ferromagnetic layer 405 has one surface that forms a first interface with the oxide capping layer 406 and the other surface that forms a second interface with the tri-layered spacer stack 410 to obtain perpendicular magnetic anisotropy.

For example, the ferromagnetic layer 401 may be made of at least one of the following materials: Fe, CoFe, CoFeB, CoPt, FePt, CoPd, FePd, and/or combinations thereof. The ferromagnetic layer 405 may be made of at least one of the following materials: Fe, CoFe, CoFeB, CoPt, FePt, CoPd, FePd, and/or combinations thereof. For example, the thickness of the ferromagnetic layer 401 may range from 5 angstroms to 20 angstroms. For example, the thickness of the ferromagnetic layer 405 may range from 5 angstroms to 20 angstroms.

According to an exemplary embodiment, the oxide capping layer 406 may be made of at least one of the following materials: MgO, $AlO_x$, $TiO_x$, $HfO_x$, $MgAlO_x$, $MgZnO_x$, $SiO_x$, $TaO_x$, $VO_x$, and/or combinations thereof. According to an exemplary embodiment, the thickness of the oxide capping layer 406 may range from 0.1 angstroms to 10 angstroms.

According to an exemplary embodiment, the tri-layered spacer stack 410 comprises a non-magnetic layer 402, a discontinuous, insulating oxide layer (also referred to as an oxide dust layer) 403, and a non-magnetic layer 404. The oxide dust layer 403 is sandwiched by the non-magnetic layer 402 and the non-magnetic layer 404. According to an exemplary embodiment, the non-magnetic layers 402 and 404 may be made of at least one of the following materials: Ta, Mo, W, Ir, Rh, Zr, Nb, Hf, Cr, V, Mg, Bi, and/or combinations thereof. According to an exemplary embodiment, the thickness of the non-magnetic layer 402 may range from 0.5 angstroms to 5 angstroms. According to an exemplary embodiment, the thickness of the non-magnetic layer 404 may range from 0.5 angstroms to 5 angstroms. The oxide dust layer 403 may be made of at least one of the following materials: MgO, $AlO_x$, $TiO_x$, $HfO_x$, $MgAlO_x$, $MgZnO_x$, $SiO_x$, $TaO_x$, $VO_x$, and/or combinations thereof. According to an exemplary embodiment, the thickness of the oxide capping layer 406 may range from 0.1 angstroms to 10 angstroms.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A composite storage layer for magnetic memory devices, comprising:
    a first ferromagnetic layer;
    a tri-layered spacer stack disposed on the first ferromagnetic layer;
    a second ferromagnetic layer disposed on the tri-layered spacer stack; and
    an oxide capping layer on the second ferromagnetic layer, wherein the tri-layered spacer stack comprises a first non-magnetic metal layer, a discontinuous, insulating oxide layer, and a second non-magnetic metal layer.

2. The composite storage layer for magnetic memory devices according to claim 1, wherein the first ferromagnetic layer and the second ferromagnetic layer are comprised of Fe-rich alloys or magnetic multilayer.

3. The composite storage layer for magnetic memory devices according to claim 1, wherein the first ferromagnetic layer is disposed directly on a tunnel barrier layer.

4. The composite storage layer for magnetic memory devices according to claim 3, wherein the first ferromagnetic layer has a surface that forms a first interface with the tunnel barrier layer and the other surface that forms a second interface with the tri-layered spacer stack to obtain perpendicular magnetic anisotropy.

5. The composite storage layer for magnetic memory devices according to claim 4, wherein the second ferromagnetic layer has one surface that forms a first interface with the oxide capping layer and the other surface that forms a second interface with the tri-layered spacer stack to obtain perpendicular magnetic anisotropy.

6. The composite storage layer for magnetic memory devices according to claim 1, wherein the discontinuous, insulating oxide layer is sandwiched by the first non-magnetic layer and the second non-magnetic layer.

7. The composite storage layer for magnetic memory devices according to claim 1, wherein the first non-magnetic layer and the second non-magnetic layer are made of at least one of the following materials: Ta, Mo, W, Ir, Rh, Zr, Nb, Hf, Cr, V, Mg, Bi, and/or combinations thereof.

8. The composite storage layer for magnetic memory devices according to claim 1, wherein the first non-magnetic layer and the second non-magnetic layer have a thickness ranging from 0.5 angstroms to 2 nanometers.

9. The composite storage layer for magnetic memory devices according to claim 1, wherein the discontinuous, insulating oxide layer is made of at least one of the following materials: MgO, $AlO_x$, $TiO_x$, $HfO_x$, $MgAlO_x$, $MgZnO_x$, $SiO_x$, $TaO_x$, $VO_x$, and/or combinations thereof.

10. The composite storage layer for magnetic memory devices according to claim 1, wherein the discontinuous, insulating oxide layer has a thickness ranging from 1 angstroms to 20 angstroms.

11. The composite storage layer for magnetic memory devices according to claim 1, wherein the oxide capping layer is made of at least one of the following materials: MgO, $AlO_x$, $TiO_x$, $HfO_x$, $MgAlO_x$, $MgZnO_x$, $SiO_x$, $TaO_x$, $VO_x$, and/or combinations thereof.

12. The composite storage layer for magnetic memory devices according to claim 1, wherein the oxide capping layer has a thickness ranging from 0.1 angstroms to 10 angstroms.

13. A magnetic tunnel junction (MTJ) element for magnetic memory devices, comprising:
a reference layer;
a tunnel barrier layer contacting the reference layer; and
a composite storage layer contacting the tunnel barrier layer; wherein the composite storage layer comprises a first ferromagnetic layer, a tri-layered spacer stack disposed on the first ferromagnetic layer, a second ferromagnetic layer disposed on the tri-layered spacer stack, and an oxide capping layer on the second ferromagnetic layer, wherein the tri-layered spacer stack comprises a first non-magnetic layer, a discontinuous, insulating oxide layer, and a second non-magnetic layer.

14. The MTJ element for magnetic memory devices according to claim 13, wherein the reference layer is made of at least one of the following materials: CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, CoCr, CoCrB, CoCrPt, CoCrPtB, CoCrPd, CoCrTi, CoCrZr, CoCrHf, CoCrV, CoCrNb, CoCrTa, $[Co/Pt]_n$, $[Co/Pd]_n$, $[Co/Ni]_n$, $[CoFe/Pt]_n$, $[Co/Pt(Pd)]_n$, or any combination thereof.

15. The MTJ element for magnetic memory devices according to claim 13, wherein the tunnel barrier layer is made of at least one of the following materials: MgO, $AlO_x$, MgAlO, MgZnO, HfO, or any combination thereof.

16. The MTJ element for magnetic memory devices according to claim 13, wherein the first ferromagnetic layer and the second ferromagnetic layer are comprised of Fe-rich alloys or magnetic multilayer.

17. The MTJ element for magnetic memory devices according to claim 13, wherein the first ferromagnetic layer is disposed directly on a tunnel barrier layer.

18. The MTJ element for magnetic memory devices according to claim 17, wherein the first ferromagnetic layer has a surface that forms a first interface with the tunnel barrier layer and the other surface that forms a second interface with the tri-layered spacer stack to obtain perpendicular magnetic anisotropy.

19. The MTJ element for magnetic memory devices according to claim 18, wherein the second ferromagnetic layer has one surface that forms a first interface with the oxide capping layer and the other surface that forms a second interface with the tri-layered spacer stack to obtain perpendicular magnetic anisotropy.

20. The MTJ element for magnetic memory devices according to claim 13, wherein the discontinuous, insulating oxide layer is sandwiched by the first non-magnetic layer and the second non-magnetic layer.

21. The MTJ element for magnetic memory devices according to claim 13, wherein the first non-magnetic layer and the second non-magnetic layer are made of at least one of the following materials: Ta, Mo, W, Ir, Rh, Zr, Nb, Hf, Cr, V, Mg, Bi, and/or combinations thereof.

22. The MTJ element for magnetic memory devices according to claim 13, wherein the first non-magnetic layer and the second non-magnetic layer have a thickness ranging from 0.5 angstroms to 2 nanometers.

23. The MTJ element for magnetic memory devices according to claim 13, wherein the discontinuous, insulating oxide layer is made of at least one of the following materials: MgO, $AlO_x$, $TiO_x$, $HfO_x$, $MgAlO_x$, $MgZnO_x$, $SiO_x$, $TaO_x$, $VO_x$, and/or combinations thereof.

24. The MTJ element for magnetic memory devices according to claim 13, wherein the discontinuous, insulating oxide layer has a thickness ranging from 0.1 angstroms to 10 angstroms.

25. The MTJ element for magnetic memory devices according to claim 13, wherein the oxide capping layer is made of at least one of the following materials: MgO, $AlO_x$, $TiO_x$, $HfO_x$, $MgAlO_x$, $MgZnO_x$, $SiO_x$, $TaO_x$, $VO_x$, and/or combinations thereof.

26. The MTJ element for magnetic memory devices according to claim 13, wherein the oxide capping layer has a thickness ranging from 0.1 angstroms to 10 angstroms.

* * * * *